(12) United States Patent
Bicakci et al.

(10) Patent No.: US 6,897,798 B1
(45) Date of Patent: May 24, 2005

(54) METHOD AND APPARATUS FOR CONTROLLING SWITCHING NOISE IN DIGITAL-TO-ANALOG INTERFACE

(75) Inventors: Ara Bicakci, San Jose, CA (US); Gurjinder Singh, Gilroy, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/765,387

(22) Filed: Jan. 26, 2004

(51) Int. Cl.[7] .............................. H03M 1/66
(52) U.S. Cl. ........................... 341/144; 341/118
(58) Field of Search ....................... 341/118, 144, 341/153, 154

(56) References Cited

U.S. PATENT DOCUMENTS 4,521,765 A * 6/1985 Wang et al. ............... 341/154
6,329,940 B1 * 12/2001 Dedic ........................ 341/144

* cited by examiner

Primary Examiner—Howard L. Williams
(74) Attorney, Agent, or Firm—Thelen Reid & Priest, LLP

(57) ABSTRACT

A method and apparatus control switching noise in a digital-to-analog interface in a mixed-signal circuit. The digital-to-analog interface includes a first plurality (K) of switching elements and a second plurality (M) of dummy switching elements, the second plurality (M) being smaller than the first plurality (K). The switching noise control includes (a) receiving a digital data signal, (b) determining a number (N) of the switching elements to be switched for the digital data signal, and (c) switching the second plurality (M) less the number (N) of the dummy switching elements simultaneously with switching the number (N) of the switching elements.

37 Claims, 8 Drawing Sheets

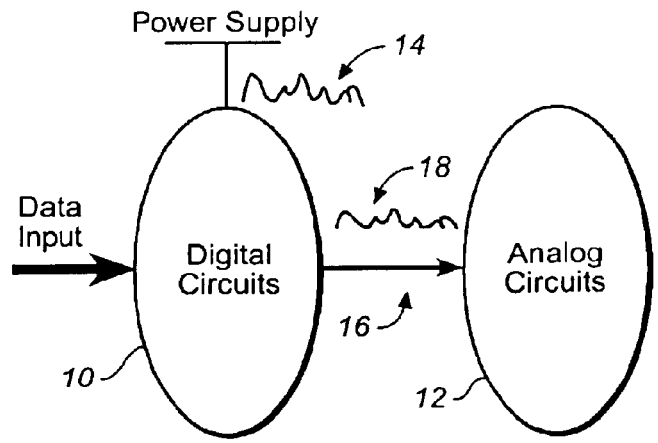
FIG._1 *(PRIOR ART)*
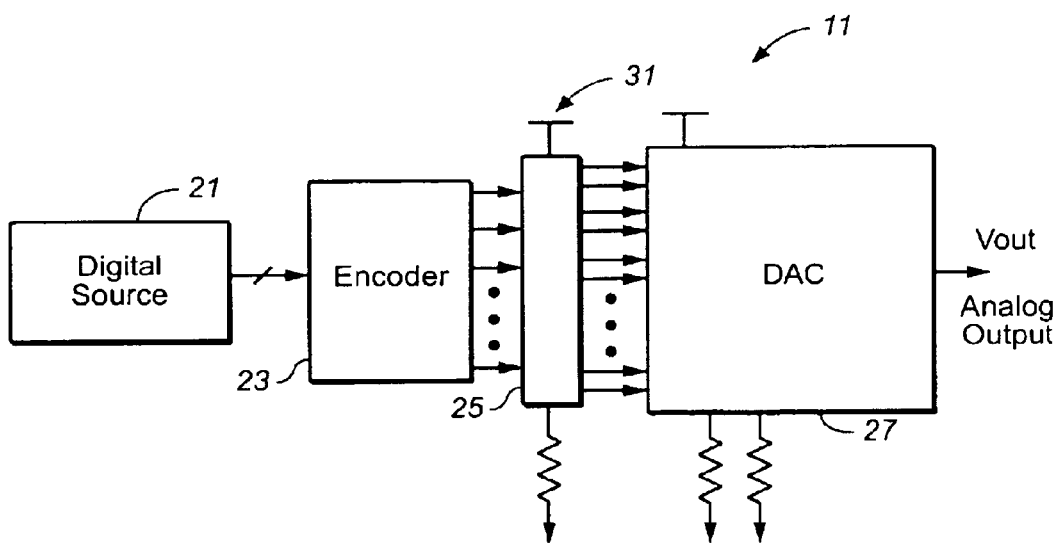
FIG._2A

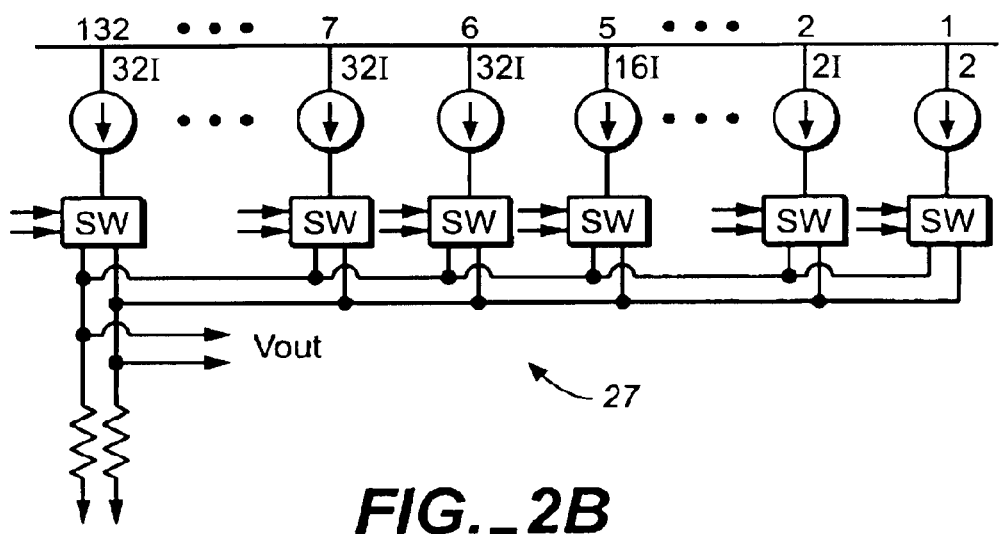
FIG._2B
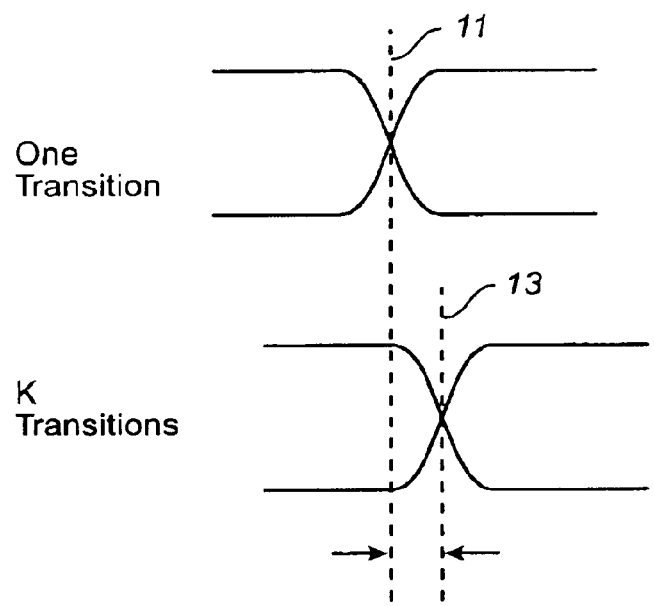
FIG._2C

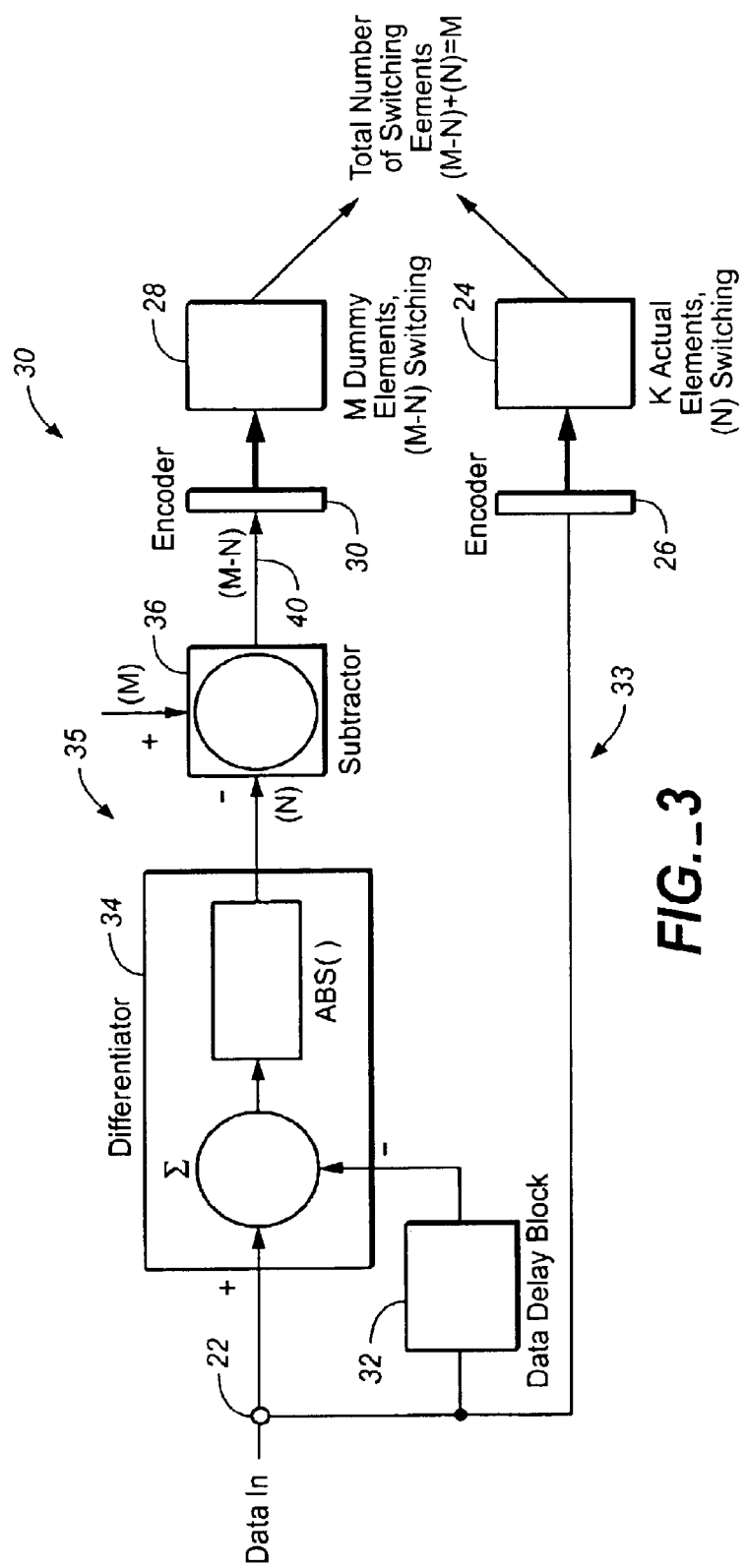
FIG._3

FIG. 4

DAC Example 1 (7-bit Thermometer Encoded, 5-bit Binary Encoded), K=132

| Signal Frequency (MHz) | Number of Transitions/Switching (N) |
|---|---|
| 0.5 | 6 |
| 1 | 8 |
| 2 | 10 |
| 3 | 13 |
| 4 | 15 |
| 5 | 17 |
| 6 | 21 |
| 7 | 23 |
| 8 | 26 |
| 9 | 28 |
| 10 | 31 |

FIG. 5

DAC Example 2 (10-bit Thermometer Encoded, 2-bit Binary Encoded), K=1025

| Signal Frequency (MHz) | Number of Transitions/Switching (N) |
|---|---|
| 0.5 | 14 |
| 1 | 24 |
| 2 | 45 |
| 3 | 66 |
| 4 | 88 |
| 5 | 108 |
| 6 | 130 |
| 7 | 152 |
| 8 | 173 |
| 9 | 193 |
| 10 | 214 |

FIG. 6

DAC Example 3 (2-bit Thermometer Encoded, 10-bit Binary Encoded), K=13

| Signal Frequency (MHz) | Number of Transitions/Switching (N) |
|---|---|
| 0.5 | 9 |
| 1 | 10 |
| 2 | 10 |
| 3 | 11 |
| 4 | 10 |
| 5 | 9 |
| 6 | 10 |
| 7 | 10 |
| 8 | 9 |
| 9 | 10 |
| 10 | 10 |

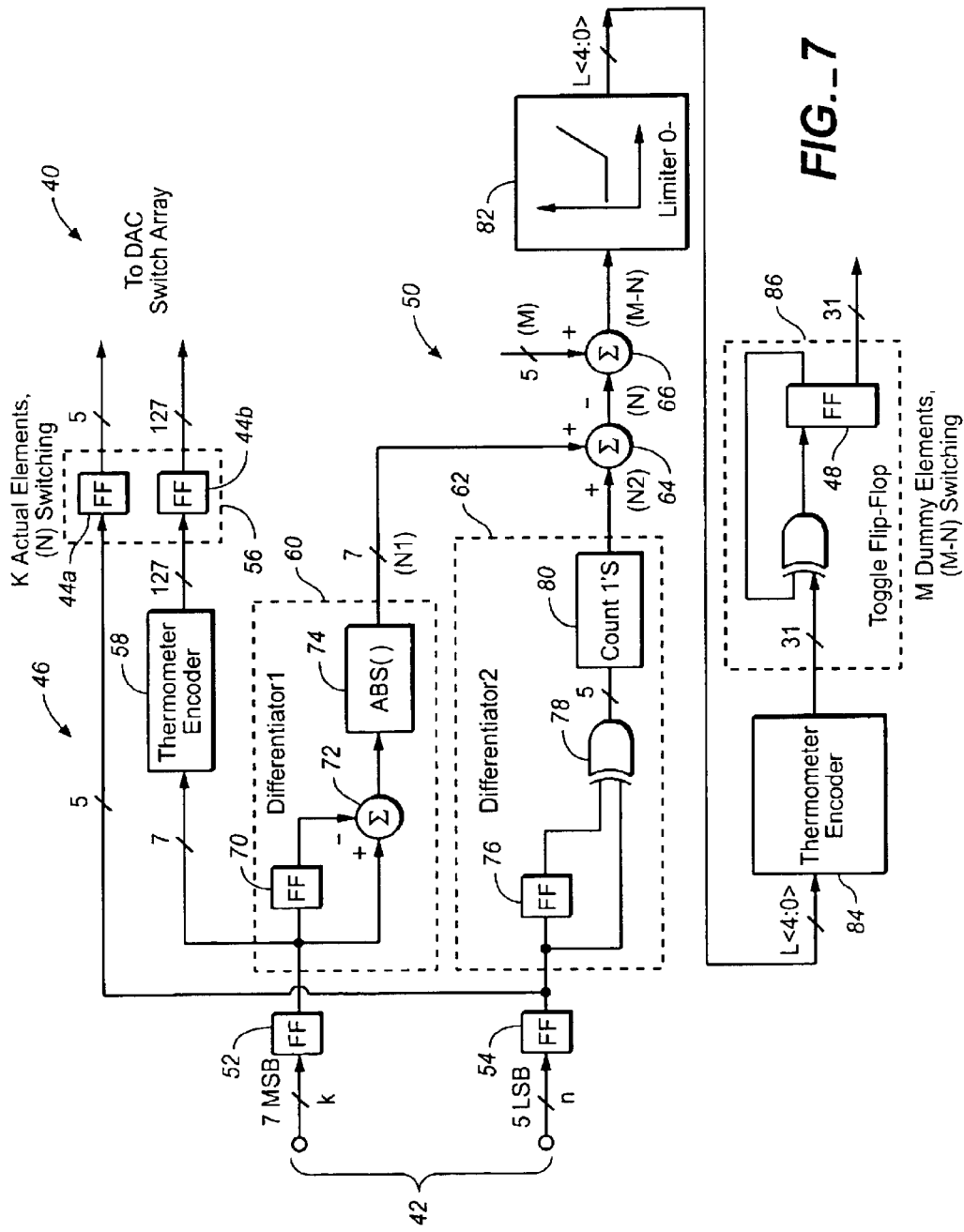
FIG._7

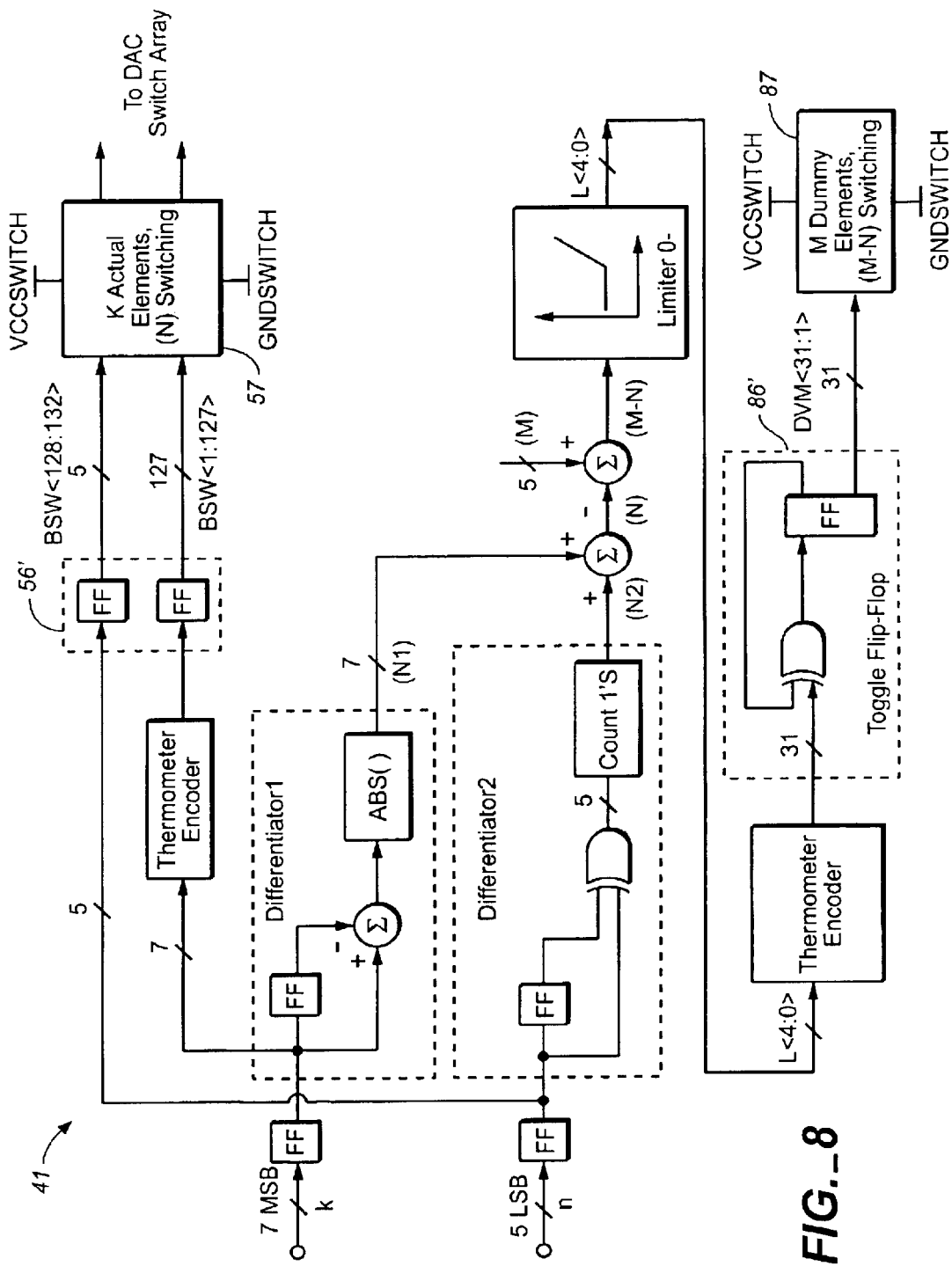
FIG._8

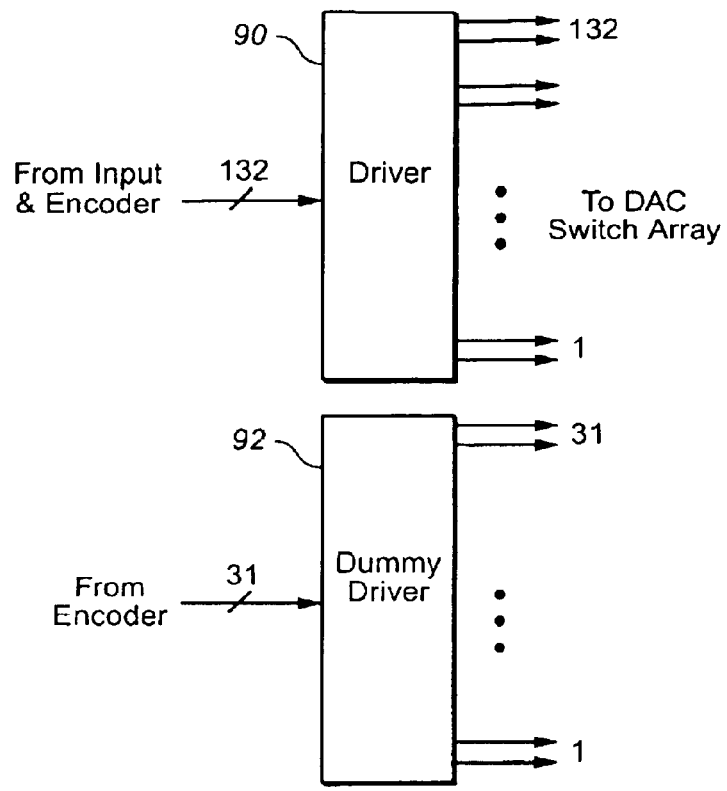
FIG._9
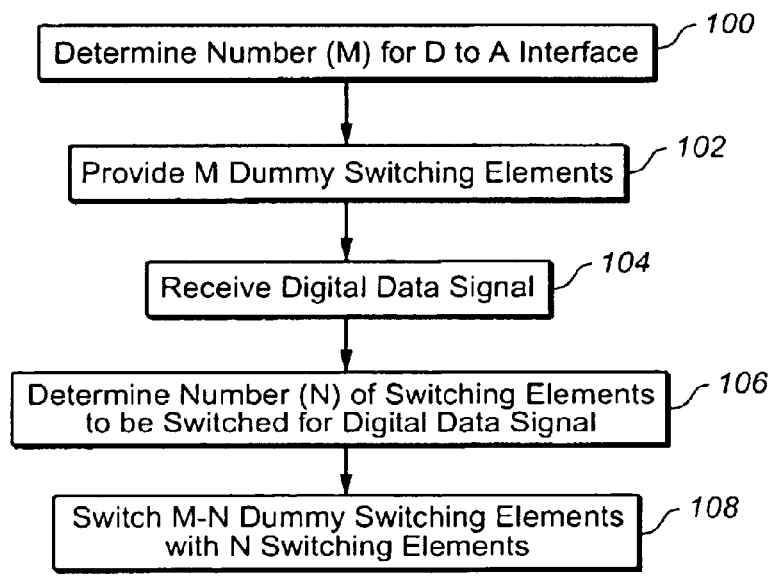
FIG._10

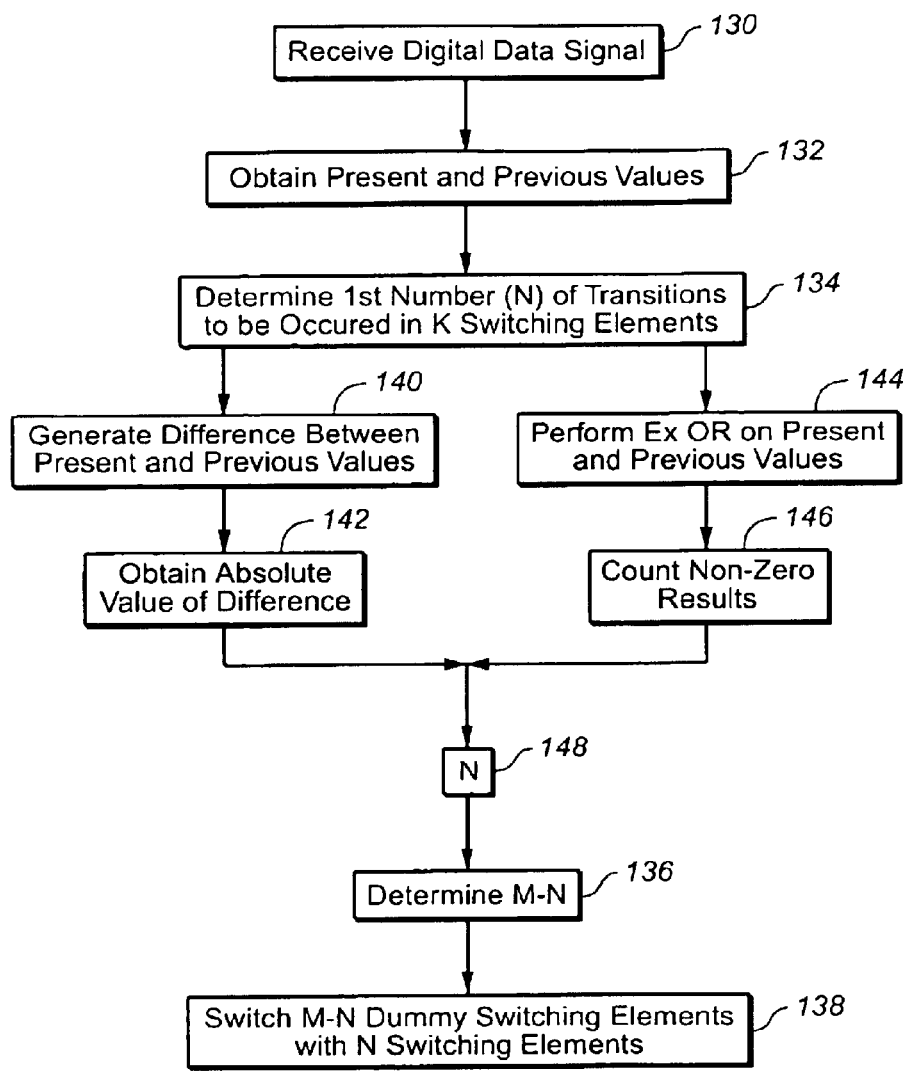
FIG._11

US 6,897,798 B1

METHOD AND APPARATUS FOR CONTROLLING SWITCHING NOISE IN DIGITAL-TO-ANALOG INTERFACE

FIELD OF THE INVENTION

The present invention relates to a mixed-signal circuit. More particularly, the present invention relates to a method and apparatus for controlling switching noise in a digital-to-analog interface in a mixed-signal circuit.

BACKGROUND OF THE INVENTION

In digital circuits, such as CMOS digital circuits, switching elements are driven synchronously, and thus a power supply current is instantaneous and proportional to the number of transitions of the switching elements happening at the given moment. Therefore, the power supply current is highly dependent upon the digital data pattern (digital code) of the input signal. This instantaneous power supply current together with finite resistance and inductance of the power supply route causes voltage fluctuations on the power supply delivered to the CMOS digital circuits.

FIG. 1 schematically illustrates such a switching noise in a mixed-signal circuit, for example, a digital-to-analog converter (DAC). In a mixed-signal circuit, switching operation in digital circuitry 10 causes data pattern dependent noise 14 on the power supply which may couple to the analog circuitry 12 (and its analog signals) via a digital-to-analog interface 16. For example, such a digital-to-analog interface 16 includes switch drivers of a DAC. Since the coupled noise 18 is dependent on a specific data pattern of the input digital data, it causes non-linear noise in the analog circuits. This means that the noise on the analog signal is neither constant, nor linear or correlated to the analog signal itself, but varies depending upon the data pattern of the digital data input to the digital interface. Such a non-linear noise is hard to reduce or control.

For example, such a pattern-dependent switching noise generated in the driver current supplies will cause the effective switching point to be modulated with the input data pattern. FIG. 2A schematically illustrates a conventional digital-to-analog interface 21 including an encoder 23, a driver circuit (switch drivers) 25, and a DAC switch array 27. A digital signal from the digital source 21 is supplied to the driver circuit 25 through the encoder 23. FIG. 2B schematically illustrates an example of the switch array 27 of a segmented current steering DAC having thermometer-coded upper 7 bits (MSB) and binary coded lower 5 bits (LSB). As shown in FIG. 2B, the switch array 27 includes 132 switches (SW). The first 5 switches (LSB: 1 to 5) are for the binary code and thus are coupled to the binary-weighted current sources (I to 16I). The remaining 127 switches are for the thermometer code (MSB: 7 to 132) and thus coupled to the identical current sources (32I). The corresponding output of the switch driver 25 drives each switch so as to steer the corresponding current source outputs to one DAC output (Vout) or its complementary.

Typically, a switch driver includes a latch (and a buffer) to synchronize all of the switch driver output signals. When a latch in the switch driver changes its state, the corresponding switch in the DAC array is driven. When the latches synchronously change their states in accordance with input digital data, such transition causes noise in the switch driver power supplies 31, which modulates the effective crossing point (switching point) of the switch driver output signals. For example, as shown in FIG. 2C, the switching point 11 for sampling data when only one (or few) of the latches change the state and the switching point 13 when all (or most) of the latches change the state may be different. Such a shift or modulation in the effective switching point in switch drivers in turn results in pattern-dependent jitter in the output analog signal, and degrades the dynamic performance of the DAC.

Applicants realized that such an undesirable non-linear nature of the noise on the analog signal can be avoided by making the switching noise data pattern-independent by ensuing a constant switching activity in the digital circuitry. Such a constant switching activity will result in an offset or regular noise tones, which may be tolerated in most of the applications. One solution is to double the digital hardware and provide an extra switching element for each switching element that is normally used in the interface. The extra switching element is activated every time the corresponding original switching element is idle (i.e., not switching) so as to generate the same number of transitions regardless of the input data pattern. However, while this "brute force" solution can ensure constant switching activity, it doubles the interface circuitry and may increase the power consumption several times. In addition, this solution may also generate stronger regular tones.

Accordingly, it would be desirable to provide a switching noise control in a more hardware and power efficient manner.

BRIEF DESCRIPTION OF THE INVENTION

A method and apparatus control switching noise in a digital-to-analog interface in a mixed-signal circuit. The digital-to-analog interface includes a first plurality (K) of switching elements and a second plurality (M) of dummy switching elements, the second plurality (M) being smaller than the first plurality (K). The switching noise control includes (a) receiving a digital data signal, (b) determining a number (N) of the switching elements to be switched for the digital data signal, and (c) switching the second plurality (M) less the number (N) of the dummy switching elements simultaneously with switching the number (N) of the switching elements.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is a diagram schematically illustrating an example of switching noise in a mixed-signal circuit.

FIG. 2A is a block diagram schematically illustrating a conventional digital-to-analog interface including an encoder, a driver circuit (switch drivers), and a DAC switch array.

FIG. 2B is an electrical block diagram schematically illustrating an example of a DAC switch array.

FIG. 2C is a diagram schematically illustrating an example of effective switching point modulation caused by a pattern-dependent switching noise in a driver power supplies.

FIG. 3 is a block diagram schematically illustrating a digital-to-analog interface circuit in a mixed-signal circuit in accordance with one embodiment of the present invention.

FIG. 4 is a tabular diagram illustrating an example of simulation results of the number (N) of transitions to be occurred in an over-sampled DAC at various signal frequencies of the mixed-signal circuit, in accordance with one embodiment of the present invention.

FIG. 5 is a tabular diagram illustrating an example of simulation results of the number (N) of transitions to be occurred in another over-sampled DAC at various signal frequencies of the mixed-signal circuit, in accordance with one embodiment of the present invention.

FIG. 6 is a tabular diagram illustrating an example of simulation results of the number (N) of transitions to be occurred in yet another over-sampled DAC at various signal frequencies of the mixed-signal circuit, in accordance with one embodiment of the present invention.

FIG. 7 is an electrical block diagram schematically illustrating a digital-to-analog interface circuit in a mixed-signal circuit, in accordance with one embodiment of the present invention.

FIG. 8 is an electrical block diagram schematically illustrating a digital-to-analog interface circuit in a mixed-signal circuit, in accordance with another embodiment of the present invention.

FIG. 9 is a block diagram schematically illustrating an example of actual and dummy driver arrays in accordance with one embodiment of the present invention.

FIG. 10 is a process flow diagram schematically illustrating a method for controlling switching noise in a digital-to-analog interface in a mixed-signal circuit, in accordance with one embodiment of the present invention.

FIG. 11 is a process flow diagram schematically illustrating a method for controlling switching noise in a digital-to-analog interface in a mixed-signal circuit, in accordance with one embodiment of the present invention.

DETAILED DESCRIPTION

Embodiments of the present invention are described herein in the context of a method and apparatus for controlling switching noise in a digital-to-analog interface. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

FIG. 3 schematically illustrates a digital-to-analog (DA) interface circuit 20 in a mixed-signal circuit in accordance with one embodiment of the present invention. For example, the mixed-signal circuit may be a DAC. As shown in FIG. 3, the DA interface circuit includes an input node 22 adapted to receive an input digital data, a first driver circuit 33 and a second (dummy) driver circuit 35. The first driver circuit 33 includes a first plurality (K) of switching elements (switch drivers) 24 and a first encoder 26 for the first switching elements 24. The second (dummy) driver circuit 35 includes a second plurality (M) of dummy switching elements (switch drivers) 28, a second encoder 30 for the dummy switching elements 28, a delay circuit 32 coupled to the input node 22, a differentiator 34 coupled to the input node 22 and to the delay circuit 32, and a subtractor 36 coupled between the differentiator 34 and the second encoder 30.

The switching elements 24 are actual switching elements to be used, for example, to drive a DAC switch array to convert a digital data (code) into an analog signal. The switching elements 24 may be latches, followed by corresponding buffers. The dummy switching elements 28 have the same structure as that of the switching elements 24, and also powered by the same driver supply. The actual and dummy switching elements 24 and 28 are similarly driven by the corresponding signals from the encoders 26 and 30, respectively, to change their state, but the outputs of the dummy switching elements 28 do not drive any DAC switch array.

In the first driving circuit 33, the first encoder 26 is coupled to the input node 22 and generates a first driving signal for the switching elements 24 in accordance with the input digital data (code). For example, if the input digital data includes a thermometer-coded part and a binary-coded part for a segmented DAC, the encoder 26 may only encode the thermometer-coded part and supply the binary-coded part as is. In the second driving circuit 35, the delay circuit 32 receives the input digital data and maintains a previous value of the input digital data. The differentiator 34 receives a present value of the digital data from the input node 22 and the previous value from the delay circuit 32, and determines the number (N) of the switching elements 24 to be switched (i.e., the number of transitions to be occurred in the next cycle) based on the present value and the previous value. The structure of the differentiator 34 depends upon the given data format or code scheme of the input digital data.

The subtractor 36 receives the output (number N) from the differentiator 34, subtracts the number (N) from the second plurality (M) to determine a second number (difference: M−N), and generates a dummy digital data 40. The second encoder 30 generates a second driving signal for the dummy switching elements 28 in accordance with the dummy digital data 40. The second driving signal drives the dummy switching elements 28 such that the second number (M−N) thereamong are switched. That is, the number of the dummy switching elements 28 to be switched is complementary to the number of the actual switching elements 24 to be switching, such that the total number of transitions at a given time caused by the actual and dummy switching elements 24 and 28 is always (M−N)+N=M, which is a constant and typically smaller than the total number (K) of the actual switching elements 24. By limiting the number of the dummy switching elements to this maximum number (M), hardware and power consumption can be saved.

In accordance with one embodiment of the present invention, the number (M) of the dummy switching elements 28 is a predetermined maximum number of the switching elements 24 to be switching simultaneously. The Applicants realized that all of the switching elements in the digital circuit are not necessarily switched simultaneously. This is especially true when the digital-to-analog interface is operated by a clock signal having a frequency greater than a maximum signal frequency of the mixed-signal circuit, for example, an over-sampling DAC. Therefore, the maximum number (M) of simultaneous transition of the switching elements can be found statistically or mathematically, or by simulation. For example, the number M may be determined based on the number (K) of the actual switching elements 24, a frequency of an operating clock signal of the analog-to-digital interface 20, and a maximum signal frequency of the mixed-signal circuit.

FIG. 4 shows an example of simulation results of the number (N) of transitions to be occurred in an over-sampled DAC at various signal frequencies of the mixed-signal circuit. A full-swing sine wave signal is used in system level simulations for given frequencies. In this example it is assumed that a 12-bit DAC has an update rate (sampling rate) of 140 MHz, the maximum signal frequency is 10 MHz, and that the DAC is a segmented current steering DAC, where upper 7 bits (MSB) are thermometer coded and lower 5 bits (LSB) are binary coded. A total of 127+5=132 switch driver circuits (switching elements) are needed in order to steer the corresponding current source outputs to one DAC output or its complementary. As shown in FIG. 4, for a 10-MHz full swing signal, the transition number (N) is not more than 31, which is substantially less than 132 (total number K). Therefore, it is not necessary to provide 132 dummy switching elements but only the limited number of 31 is required, and the maximum number (M) may be set to 31 in this example.

FIG. 5 shows another example of simulation results of the number (N) of transitions to be occurred in an over-sampled DAC. In this example, a 12-bit segmented DAC with 10-bit thermometer code and 2-bit binary code has the total number K=1025 switching elements. As shown in FIG. 5, for a full swing signal with the maximum frequency of 10 MHz, 214 switching may occur. In this case, the maximum number M may be chosen as 220, for example, which will save 1025−220=805 dummy switching elements compared with the brute force approach. It should be noted the number M (=220) of the dummy switching elements is not necessary exactly the same as the simulated number (214) of maximum transition to provide a leeway or room for overhead.

FIG. 6 shows yet another example of simulation results of the number (N) of transitions in a 12-bit DAC. In this example, the DAC has 2-bit thermometer code and 10-bit binary code, and thus the total K=13 switching elements. In this example, since the DAC is almost totally binary DAC, the number of dummy switching elements, for example, M=12, would be almost the same as the number of the switching elements K=13, and thus there is not much saving compared with the brute force approach. However, due to various problems associated with a binary DAC, for example, matching errors and glitches, such an almost-binary DAC is impractical in actual applications.

It should be noted that those of ordinary skill in the art will appreciate that the numbers shown in FIGS. 4–6 are not intended to be limiting and that other combinations can be used.

FIG. 7 schematically illustrates a digital-to-analog interface circuit 40 in a mixed-signal circuit, in accordance with one embodiment of the present invention. As shown in FIG. 7, the interface circuit 40 includes an input node 42, a first driver circuit 46 having a first plurality (K) of switching elements (switch driver) 56, a second driver circuit 50 including a second plurality (M) of dummy switching elements 86. The input port 42 receives an input digital data which includes k most significant bits (MSB) for thermometer encoding and remaining n bits (LSB) for binary encoding. As shown in FIG. 7, the input node 42 includes a first input buffer 52 for the k most significant bits and a second input buffer 54 for the remaining n bits. For example, the mixed-signal circuit may be a 12-bit DAC with 7 MSB for the thermometer code and 5 LSB for the binary code.

The first driving circuit 46 receives the input digital data from the input node 42 (buffers 52 and 54), and generates a first driving signal for the actual switching elements 56 in accordance with the input digital data. As shown in FIG. 7, the first driving circuit 46 includes a thermometer encoder 58 for the k most significant bits. In this example, the 7 MSB thermometer code is encoded into a 127-bit driving signal. The 5-bit binary code can drive the binary weighted switches in the DAC through the switch drivers without further encoding. The total 132-bit driving signal is applied to the actual switching elements 56. which in turn drive the DAC switch array. As shown in FIG. 7, the switching elements 56 may be flip-flops (FF) or buffers 44a and 44b. Although only one FF 44a for the binary code bits and one FF 44b for the thermometer code bits are shown in the drawing, a respective FF is provided for each bit of the driving signal, i.e., five FFs 44a for the 5 LSB and 127 FFs 44b for the 7 MSB.

The second driving circuit 50 includes a first differentiator 60, a second differentiator 62, an adder 64, a subtractor 66, the M number of dummy switching elements 86, and a thermometer encoder 84. The first differentiator 60 is coupled to the first input buffer 52, and determines a number (N1) of switching elements 56 to be switching based on a present value and the previous value of the k most significant bits of the input digital data. In accordance with one embodiment of the present invention, the first differentiator 60 may include a first delay circuit 70, a difference generator 72, and an absolute value circuit 74. As shown in FIG. 7, the first delay circuit 70 is coupled to the first input buffer 52, and maintains the previous value of the k most significant bits of the input digital data (7 MSB, in this example). The difference generator 72 receives the present value and previous value of the k most significant bits (7 MSB, in this example) from the first input buffer 52 and the first delay circuit 70, respectively, and generates a difference between the present value and the previous value of the input digital data. The absolute value circuit 74 generates an absolute value of the difference. Since the 7 MSB represent the thermometer code, the difference from the previous value (plus or minus) directly corresponds to the number of the switching elements to change the status. The number (N1) of the switching elements 56 to be switched for the 7 MSB is obtained by taking the absolute value of the difference. The number (N1) is supplied to the adder 64.

The second differentiator 62 is coupled to the second input buffer 54, and determines a number (N2) of switching elements to be switching based on a present value and the previous value of the remaining n bits (5 LSB, in this example) of the input digital data. In accordance with one embodiment of the present invention, the second differentiator 62 includes a second delay circuit 76, an exclusive-OR circuit 78, and a counter 80. The second delay circuit 76 is coupled to the second input buffer 54, and maintains a previous value of the n remaining bits (5 LSB, in this example) of the input digital data. The exclusive-OR circuit 78 performs an exclusive-OR operation on the present value and the previous value of the remaining n bits (5 LSB, in this example) of the input digital data, and the counter 80 counts non-zero bits of an output of the exclusive-OR circuit 78. Since the 5 LSB represent the binary code, an exclusive-OR operation upon each corresponding bits of the previous and present binary data yields "1" only when a transition occurs for that bit. By summing up the "1" bits, the number (N2) of the switching elements to be switched for the 5 LSB is obtained. The number (N2) is also supplied to the adder 64.

The adder 64 generates a switching number (N) by adding the number (N1) received from the first differentiator 60 and the number (N2) received from the second differentiator 62. The subtractor 66 is coupled to the adder 64, and subtracts the switching number (N) from the second plurality (M) to determine a dummy switching number (M−N) and generates a dummy digital data representing the dummy switching number. For example, in case of the number (M) of the dummy switching elements is 31, the dummy digital data may be 5-bit data Optionally, a limiter circuit 82 may be provided at the output of the subtractor. 66 so as to limit the value of the dummy digital data to zero or greater. The limiter circuit 82 prevents underflow and may be required to take care of a statistically rare situation which may not be predicted when the number M is determined, for example, by a simulation.

The thermometer encoder 84 is coupled with the subtractor 66 via the optional limiter circuit 82, and generates a 31-bit signal from the 5-bit dummy digital data. Each of the dummy switching elements 86 may be a toggle flip-flops to ensure to cause a transition in the FF 48 regardless of their previous state. The output of the encoder 84 drives the dummy switching elements 86 (FFs 48) such that the second number (M−N) thereamong are switched. Since the first number (N) of the actual switching elements 56 are switching, the total M (actual and dummy) elements are always switching regardless of the input digital data pattern. The FFs 44a, 44b, and 48 are all powered by the same driver supply (not shown).

It should be noted that it may be possible to use exclusive-OR operation in the first differentiator 60 to obtain the number (N1). Specifically, exclusive-OR and counting operations can be performed on the thermometer encoded data (output of the thermometer encoder 58, 127 bits in this example) to obtain the number (N1) of transitions. However, since the thermometer code is typically longer than the binary code, and the value of the input of the thermometer encoder is the number of non-zero bits at the output of the encoder, direct subtraction between previous and present input digital data is more efficient than exclusive-OR and counting operations.

FIG. 8 schematically illustrates another example of a digital-to-analog interface circuit 41 in a mixed-signal circuit, in accordance with one embodiment of the present invention. In the digital-to-analog interface circuit 41, the actual switching elements and dummy switching elements are latches 57 and 87, respectively, driven by a balanced clock tree. By using the latches, all of the output signals from the switching elements are synchronized. As shown in FIG. 8, the actual and dummy latches 57 and 87 share the same power (VCCSWITCH) and ground (GNDSWITCH) pins. It should be noted that although only one actual switching element (latch) 57 and one dummy switching element (latch) 87 are shown in the drawing, there are the K number of switching elements 57 and the M number of dummy switching elements 87 are provided. Also, the structure of the elements not specifically mentioned here are the same as that of the circuit 40 in FIG. 7. In this example, the latches 57, rather than the buffers (FFs) 56, interface with the DAC switch array, and thus the latches 57 are the switching elements that determine the effective switching points and the resulting analog output signals. The latches 87 are provided as the dummy switching elements to make up the number of transitions to M.

FIG. 9 schematically illustrates an example of a switch driver array 90 for the DAC switches, and a corresponding dummy switch driver array 92. The actual and dummy driver arrays 90 and 92 may be the switching elements 56 and the dummy switching elements 86 in FIG. 7, or the actual and dummy latches 57 and 87 in FIG. 8. As shown in FIG. 9, the switching elements in the switch driver array typically receive single-ended signals and generate differential signals to drive the DAC switches. The DAC switches may be the switch array 27 shown in FIG. 2B.

FIG. 10 schematically illustrates a method for controlling switching noise in a digital-to-analog interface in a mixed-signal circuit, in accordance with one embodiment of the present invention. The digital-to-analog interface includes a first plurality (K) of switching elements. For example, the mixed-signal circuit may be a DAC, or a over-sampled DAC, as described above. First, a second plurality (M) of dummy switching elements are provided to the digital-to-analog interface (102). The M dummy switching elements may be provided along with the K actual switching elements as shown in FIGS. 7–9, as described above. The second plurality (M) is smaller than the first plurality (K). Especially, when the DAC is a segmented DAC and the input digital data has a large part of thermometer-coded, the second plurality (M) can be substantially smaller than the first plurality (K). In accordance with one embodiment of the present invention, the second plurality (M) may be determined by estimating a maximum number of the switching elements to be switching simultaneously, based on the first plurality (K), a frequency of an operating clock signal of the analog-to-digital interface, and a maximum signal frequency of the mixed-signal circuit (100), and by setting the second plurality (M) substantially equal to the maximum number.

A digital data signal is received (104), and a number (N) of the switching elements to be switched for the received digital data signal is determined (106). The number (N) of the switching elements may be determined based on a difference between a present value and a previous value of the digital data signal. Then, the second plurality (M) less the number (N) of the dummy switching elements are switched simultaneously with switching number (N) of the switching elements (108). Thus, total M number of actual and dummy switching elements are always switched to produce a data pattern independent noise, which does not lead to non-linearity when coupled to the analog signals.

FIG. 11 schematically illustrates a method for controlling switching noise in a digital-to-analog interface in a mixed-signal circuit, in accordance with one embodiment of the present invention. The digital-to-analog interface including a first plurality (K) of switching elements and a second plurality (M) of dummy switching elements, for example, as shown in FIGS. 7–9. The second plurality (M) is smaller than the first plurality (K). Similarly to the previous embodiments, the second plurality (M) may be determined by estimating a maximum number of the switching elements to be switching simultaneously based on the first plurality (K), a frequency of the operating clock signal, and a maximum signal frequency of the mixed-signal circuit, and setting the second plurality (M) substantially equal to the maximum number.

A digital data signal is received in accordance with an operating clock signal of the analog-to-digital interface (130), and a present value and a previous value of the digital data signal are obtained (132). The first number (N) of transitions to be occurred in the first plurality.(K) of switching elements is determined based on the present and previous values (134). If the input digital data signal is thermometer encoded, a difference between the present value and the previous value of the digital data signal may be generated (140), and an absolute value of the difference may be obtained (142). If the input digital data signal is binary encoded, an exclusive-OR operation is performed on the present value and the previous value of the digital data signal (144), and non-zero results of the exclusive-OR operation are counted (146). If the input digital data signal includes thermometer-encoded part (typically MSB) and binary-encoded part (typically LSB), the procedures 140 and 142 are performed on the thermometer-encoded part, and the procedures 144 and 146 are performed on the binary-encoded part, and the results may be added to obtain the first number (N) of the transitions (148).

By subtracting the first number (N) from the second plurality (M), a second number (M–N) is determined (136). Then, the second number (N–M) of the dummy switching elements are driven simultaneously with switching the first number (N) of the switching elements (138). This driving the dummy switching elements (138) may include toggling the second number of the dummy switching elements. This ensures the total M transitions occurs independent of the input digital data pattern.

As described above, in accordance with embodiments of the present invention, the dummy switching elements are provided based on the maximum number of switching elements to be switched in a given clock cycle. The dummy switching elements are driven such that the same total number of actual and dummy switching elements are switched independent of the input digital data pattern so as to generated a pattern-independent noise. The amount of noise itself might be increased in accordance with the embodiments of the present invention compared to the non-linear noise in a conventional system without dummy switching elements. However, a pattern-independent and substantially constant noise in accordance with the embodiments of the present invention can be tolerated in most applications since it does not cause non-linearity in the analog signals. In addition, the number of the dummy switching elements are more limited (ideally necessary and sufficient for a specific mixed-signal system), less hardware and power are needed to control the switching noise.

It should be noted that the present invention is not limited to a specific code scheme of a DAC, but also applicable to various DAC code systems including binary, thermometer, 1 of n, linear, segmented, decomposed, and combinations thereof.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for controlling switching noise in a digital-to-analog interface in a mixed-signal circuit, the digital-to-analog interface including a first plurality (K) of switching elements, said method comprising:
providing a second plurality (M) of dummy switching elements to the digital-to-analog interface, the second plurality (M) being smaller than the first plurality (K);
receiving a digital data signal;
determining a number (N) of the switching elements to be switched for the digital data signal; and
switching the second plurality (M) less the number (N) of the dummy switching elements simultaneously with switching the number (N) of the switching elements.

2. The method of claim 1, further comprising:
estimating a maximum number of the switching elements to be switching simultaneously based on the first plurality (K), a frequency of an operating clock signal of the analog-to-digital interface, and a maximum signal frequency of the mixed-signal circuit; and
setting the second plurality (M) substantially equal to the maximum number.

3. The method of claim 2, wherein the operating clock signal has a frequency greater than the maximum signal frequency of the mixed-signal circuit.

4. The method of claim 1, wherein said determining the first number (N) of the switching elements is based on a difference between a present value and a previous value of the digital data signal.

5. The method of claim 1, wherein the digital-to-analog interface includes a digital-to-analog converter (DAC).

6. A method for controlling switching noise in a digital-to-analog interface in a mixed-signal circuit, the digital-to-analog interface including a first plurality (K) of switching elements and a second plurality (M) of dummy switching elements, the second plurality (M) being smaller than the first plurality (K), said method comprising:
receiving a digital data signal in accordance with an operating clock signal of the analog-to-digital interface;
determining a first number (N) of transitions to be occurred in the first plurality (K) of switching elements based on the digital data signal;
determining a second number by subtracting the first number (N) from the second plurality (M); and
driving the second number of the dummy switching elements simultaneously with switching the first number (N) of the switching elements.

7. The method of claim 6, further comprising:
estimating a maximum number of the switching elements to be switching simultaneously based on the first plurality (K), a frequency of the operating clock signal, and a maximum signal frequency of the mixed-signal circuit; and
setting the second plurality (M) substantially equal to the maximum number.

8. The method of claim 7, wherein the frequency of the operating clock signal is greater than the maximum signal frequency.

9. The method of claim 6, wherein said determining the first number (N) of transitions comprising;

generating a difference between a present value and a previous value of the digital data signal; and obtaining an absolute value of the difference.

10. The method of claim 6, wherein said determining the first number (N) of transitions comprising;

performing an exclusive-OR operation on a present value and a previous value of the digital data signal; and counting non-zero results of the exclusive-OR operation.

11. The method of claim 6, wherein said driving comprising:

toggling the second number of the dummy switching elements.

12. The method of claim 6, wherein the digital-to-analog interface includes a digital-to-analog converter (DAC).

13. A digital-to-analog interface circuit in a mixed-signal circuit, comprising:

an input node adapted to receive an input digital data;

a first plurality (K) of switching elements;

a first encoder coupled to said input node, adapted to generate a first driving signal for the switching elements in accordance with the input digital data;

a second plurality (M) of dummy switching elements;

a delay circuit coupled to said input node, adapted to maintain a previous value of the input digital data;

a differentiator coupled to said input node and said delay circuit, adapted to determine a number (N) of the switching elements to be switched based on a present value and the previous value of the input digital data;

a subtractor coupled to said differentiator, adapted to determine a second number (M−N) by subtracting the number (N) from the second plurality (M) to generate a dummy digital data; and a second encoder coupled with said subtractor, adapted to generate a second driving signal for the dummy switching elements in accordance with the dummy digital data, the second driving signal switching the second number of the dummy switching elements.

14. The circuit of claim 13, wherein the second plurality (M) is a predetermined maximum number of the switching elements to be switched simultaneously, determined based on the first plurality (K), a frequency of an operating clock signal of the analog-to-digital interface, and a maximum signal frequency of the mixed-signal circuit.

15. The circuit of claim 13, wherein the operating clock signal has a frequency greater than a maximum signal frequency of the mixed-signal circuit.

16. The circuit of claim 13, further comprising:

a limiter circuit coupled to an output of the subtractor, adapted to limit a value of the dummy digital data to zero or greater.

17. The circuit of claim 13, wherein the input digital data includes k most significant bits (MSB) for thermometer encoding and remaining bits (LSB) for binary encoding.

18. The circuit of claim 13, wherein each of said switching elements includes a flip-flop, and each of said dummy switching elements includes a toggle flip-flop.

19. The circuit of claim 13, wherein each of said switching elements and said dummy switching elements includes a latch.

20. A digital-to-analog interface circuit in a mixed-signal circuit, comprising:

an input node adapted to receive an input digital data including k most significant bits (MSB) for thermometer encoding and remaining n bits (LSB) for binary encoding, said input node comprising a first input buffer for the k most significant bits and a second input buffer for the remaining n bits;

a first plurality (K) of switching elements;

a first encoder coupled to said input node, adapted to generate a first driving signal for the switching elements in accordance with the input digital data, said first encoder including a thermometer encoder for the k most significant bits (MSB);

a second plurality (M) of dummy switching elements;

a first differentiator coupled to said first input buffer, adapted to determine a number (N1) of switching elements to be switched based on a present value and the previous value of the k most significant bits of the input digital data;

a second differentiator coupled to said second input buffer, adapted to determine a number (N2) of switching elements to be switched based on a present value and the previous value of the remaining n bits (LSB) of the input digital data;

an adder adapted to generate a switching number (N) by adding the number (N1) received from the first differentiator and the number (N2) received from the second differentiator;

a subtractor coupled to said adder, adapted to determine a dummy switching number (M−N) by subtracting the switching number (N) from the second plurality (M) to generate a dummy digital data; and a second encoder coupled with said subtractor, adapted to generate a second driving signal for the dummy switching elements in accordance with the dummy digital data, the second driving signal switching the second number of the dummy switching elements.

21. The circuit of claim 20, wherein the second plurality (M) is a predetermined maximum number of the switching elements to be switched simultaneously, estimated based on the first plurality (K), a frequency of an operating clock signal of the analog-to-digital interface, and a maximum signal frequency of the mixed-signal circuit.

22. The circuit of claim 20, wherein the operating clock signal has a frequency greater than a maximum signal frequency of the mixed-signal circuit.

23. The circuit of claim 20, further comprising:

a limiter circuit coupled to an output of the subtractor, adapted to limit a value of the dummy digital data to zero or greater.

24. The circuit of claim 20, wherein said first differentiator comprising:

a first delay circuit coupled to said first input buffer, adapted to maintain a previous value of the k most significant bits of the input digital data;

a difference generator to generate a difference between the present value and the previous value of the k most significant bits of the input digital data; and an absolute value circuit to generate an absolute value of the difference.

25. The circuit of claim 20, wherein said second differentiator comprising:

a second delay circuit coupled to said second input buffer, adapted to maintain a previous value of the n remaining bits of the input digital data;

an exclusive-OR circuit to perform an exclusive-OR operation on the present value and the previous value of the remaining n bits of the input digital data; and a counter to count non-zero bits of an output of the exclusive-OR circuit.

26. The circuit of claim 20, wherein said second encoder comprising:

a thermometer encoder.

27. The circuit of claim 20, wherein each of said switching elements includes a flip-flop, and each of said dummy switching elements includes a toggle flip-flop.

28. The circuit of claim 20, wherein each of said switching elements and said dummy switching elements includes a latch.

29. An apparatus for controlling switching noise in a digital-to-analog interface in a mixed-signal circuit, the digital-to-analog interface including a first plurality (K) of switching elements, said apparatus comprising:

a second plurality (M) of dummy switching elements to the digital-to-analog interface, the second plurality (M) being smaller than the first plurality (K);

means for receiving a digital data signal;

means for determining a number (N) of the switching elements to be switched for the digital data signal; and means for switching the second plurality (M) less the number (N) of the dummy switching elements simultaneously with switching the number (N) of the switching elements.

30. The apparatus of claim 29, wherein the second plurality (M) is an estimated maximum number of the switching elements to be switched simultaneously, determined based on the first plurality (K), a frequency of an operating clock signal of the analog-to-digital interface, and a maximum signal frequency of the mixed-signal circuit.

31. The apparatus of claim 30, wherein the operating clock signal has a frequency greater than the maximum signal frequency of the mixed-signal circuit.

32. An apparatus for controlling switching noise in a digital-to-analog interface in a mixed-signal circuit, the digital-to-analog interface including a first plurality (K) of switching elements and a second plurality (M) of dummy switching elements, the second plurality (M) being smaller than the first plurality (K), said apparatus comprising:

means for receiving a digital data signal in accordance with an operating clock signal of the analog-to-digital interface;

means for determining a first number (N) of transitions to be occurred in the first plurality of switching elements in an operating clock cycle based on the digital data signal;

means for determining a second number by subtracting the first number (N) from the second plurality (M); and means for driving the second number of the dummy switching elements simultaneously with switching the first number (N) of the switching elements.

33. The apparatus of claim 32, wherein the second plurality (M) is an estimated maximum number of the switching elements to be switched simultaneously, determined based on the first plurality (K), a frequency of an operating clock signal of the analog-to-digital interface, and a maximum signal frequency of the mixed-signal circuit.

34. The apparatus of claim 33, wherein the frequency of the operating clock signal is greater than the maximum signal frequency.

35. The apparatus of claim 32, wherein said means for determining the first number (N) of transitions comprising:

means for generating a difference between a present value and the previous value of the digital data signal; and means for calculating an absolute value of the difference.

36. The apparatus of claim 32, wherein said means for determining the first number (N) of transitions comprising:

means for performing an exclusive-OR operation on a present value and the previous value of the digital data signal; and means for counting non-zero results of the exclusive-OR operation.

37. The apparatus of claim 32, wherein said means for driving comprising:

means for toggling the second number of the dummy switching elements.

* * * * *